(12) United States Patent
Struhsaker et al.

(10) Patent No.: US 10,477,715 B2
(45) Date of Patent: Nov. 12, 2019

(54) PIVOTING TOWER ASSEMBLY

(71) Applicant: TIONESTA, LLC, San Antonio, TX (US)

(72) Inventors: Paul Struhsaker, San Antonio, TX (US); Rex Frodge, San Antonio, TX (US)

(73) Assignee: TIONESTA, LLC, Austin, TX (US)

( * ) Notice: Subject to any disclaimer, the term of this patent is extended or adjusted under 35 U.S.C. 154(b) by 0 days.

(21) Appl. No.: 15/915,537

(22) Filed: Mar. 8, 2018

(65) Prior Publication Data

US 2019/0150310 A1    May 16, 2019

Related U.S. Application Data

(63) Continuation-in-part of application No. 29/626,334, filed on Nov. 16, 2017.

(51) Int. Cl.
| | | |
|---|---|---|
| *H05K 7/02* | (2006.01) | |
| *H05K 7/04* | (2006.01) | |
| *H02S 20/30* | (2014.01) | |
| *E01F 9/30* | (2016.01) | |
| *H01B 7/00* | (2006.01) | |
| *H02S 40/38* | (2014.01) | |

(52) U.S. Cl.
CPC ............. *H05K 7/02* (2013.01); *E01F 9/30* (2016.02); *H02S 20/30* (2014.12); *H01B 7/0045* (2013.01); *H02S 40/38* (2014.12)

(58) Field of Classification Search
CPC ............ H05K 7/02; H02S 20/30; H02S 40/38
USPC .................................................. 361/809–810
See application file for complete search history.

(56) References Cited

U.S. PATENT DOCUMENTS

| | | | | |
|---|---|---|---|---|
| 2,985,261 | A * | 5/1961 | Kubesh | ............... E04H 12/187 |
| | | | | 174/45 R |
| 3,364,635 | A * | 1/1968 | Guggemos | .............. F21V 21/36 |
| | | | | 174/45 R |
| 4,167,740 | A | 9/1979 | Shriver | |
| 4,590,718 | A | 5/1986 | Angeloff | |
| 5,782,042 | A * | 7/1998 | Klein | .................... E04H 12/187 |
| | | | | 52/116 |

(Continued)

FOREIGN PATENT DOCUMENTS

AU    2228083 A    6/1984

OTHER PUBLICATIONS

First Examination Report in corresponding New Zealand Application No. 751471, dated Jul. 29, 2019 (4 pages).

(Continued)

*Primary Examiner* — Hung S. Bui
(74) *Attorney, Agent, or Firm* — Osha Liang LLP

(57) ABSTRACT

A method for installing a pivoting tower assembly is disclosed. The method involves mounting at least one electrical component onto a pivoting pole of the pivoting tower assembly, while the pivoting tower assembly is in an assembly position having the pivoting pole oriented horizontally and parallel to the ground, connecting an electrical wire from the at least one electrical component to a wire harness permitting the electrical wire to travel inside the pivoting pole, and pivoting the pivoting pole, about an axis parallel to the ground, from the assembly position into an erect, vertical position with the at least one mounted electrical component.

15 Claims, 9 Drawing Sheets

(56) References Cited

U.S. PATENT DOCUMENTS

| | | | | |
|---|---|---|---|---|
| 6,058,299 A | * | 5/2000 | Lyseng | H04B 1/38 |
| | | | | 455/347 |
| 7,089,705 B1 | * | 8/2006 | Lieberman | E04H 12/187 |
| | | | | 248/670 |
| 8,910,431 B2 | * | 12/2014 | Egan | E04H 12/345 |
| | | | | 52/116 |
| 9,995,443 B2 | * | 6/2018 | Lai | F21L 4/08 |
| 2002/0149536 A1 | * | 10/2002 | Safakhah | H01Q 1/1207 |
| | | | | 343/882 |
| 2011/0271608 A1 | | 11/2011 | Egan et al. | |
| 2014/0115977 A1 | | 5/2014 | Egan et al. | |

OTHER PUBLICATIONS

Extended European Search Report issued in corresponding European Application No. 19161376.9, dated Aug. 7, 2019 (9 pages).

* cited by examiner

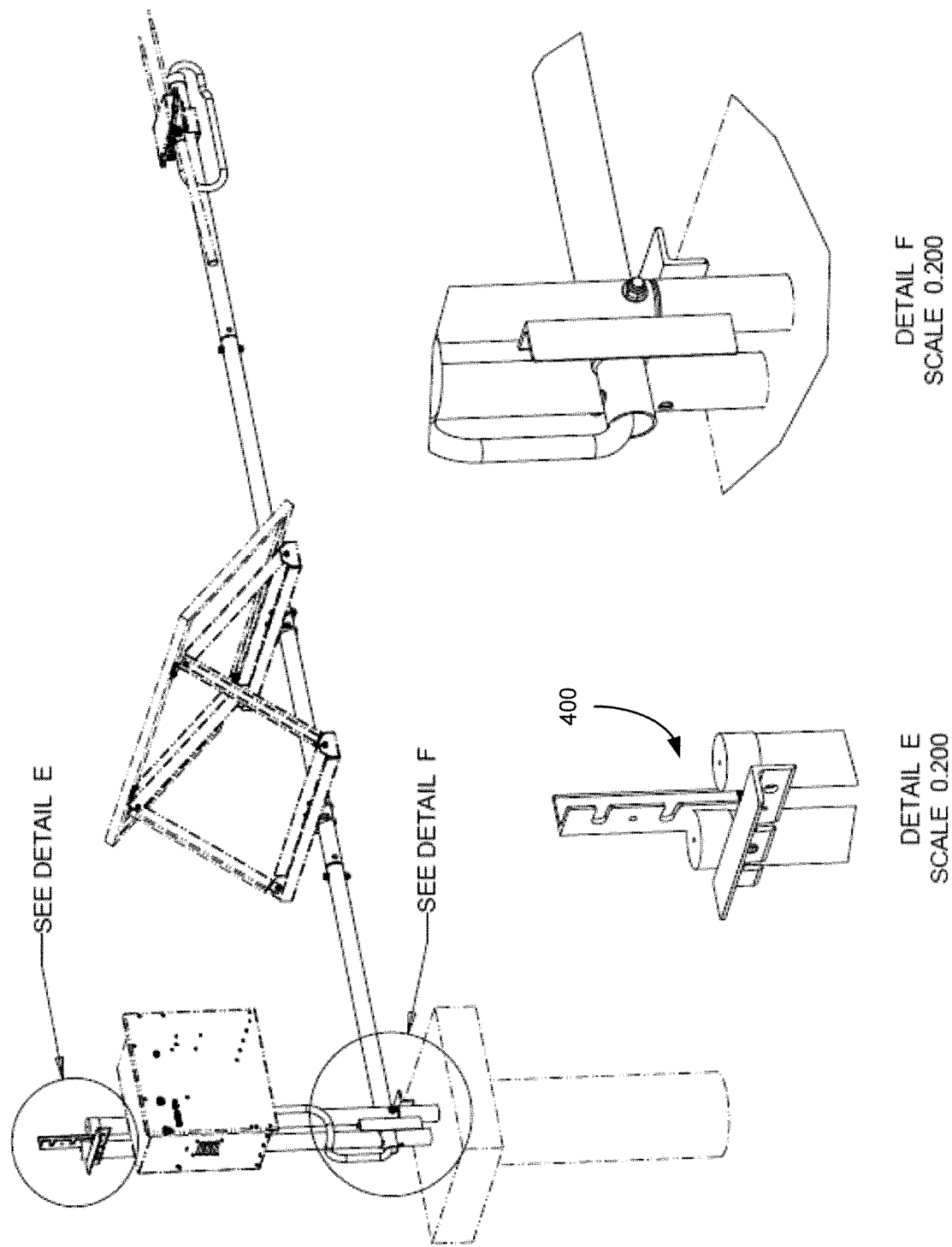

__US 10,477,715 B2__

PIVOTING TOWER ASSEMBLY

CROSS-REFERENCE TO RELATED APPLICATIONS

This application claims benefit under 35 U.S.C. § 120 as a continuation-in-part of design application no. 29/626,334, entitled Pivoting Tower Assembly, filed on Nov. 16, 2017.

BACKGROUND OF INVENTION

It is common practice for a team of engineers or construction workers using heavy machinery to install tall poles for data collection along the roadside. These poles may be mounted with solar panels, antennas, and other equipment after the poles are erected, often requiring elevation machinery to be able to manually reach the tops of the erect poles.

SUMMARY OF INVENTION

In general, in one aspect, the invention relates to a method for installing a pivoting tower assembly, comprising mounting at least one electrical component onto a pivoting pole of the pivoting tower assembly, while the pivoting tower assembly is in an assembly position having the pivoting pole oriented horizontally and parallel to the ground, connecting an electrical wire from the at least one electrical component to a wire harness permitting the electrical wire to travel inside the pivoting pole, and pivoting the pivoting pole, about an axis parallel to the ground, from the assembly position into an erect, vertical position with the at least one mounted electrical component.

In general, in one aspect, the invention relates to a pivoting tower assembly, comprising a pivoting pole configured to pivot from an assembly position in which the pivoting pole is oriented horizontally and parallel to the ground, to an erect position in which the pivoting pole is oriented vertically and perpendicular to the ground, a base comprising a pivoting mechanism about which the pivoting pole pivots, and at least one electrical component mounted onto the pivoting pole when the pivoting pole is in the assembly position, wherein the pivoting pole comprises a wire harness configured to facilitate the traveling of at least one electrical wire from the at least one electrical component inside the pivoting pole.

Other aspects of the invention will be apparent from the following description and the appended claims.

BRIEF DESCRIPTION OF DRAWINGS

FIGS. 4A, 4B, and 4C show rotating brackets for holding the pivoting pole vertical in accordance with one or more embodiments of the invention.

DETAILED DESCRIPTION

Figure 1:
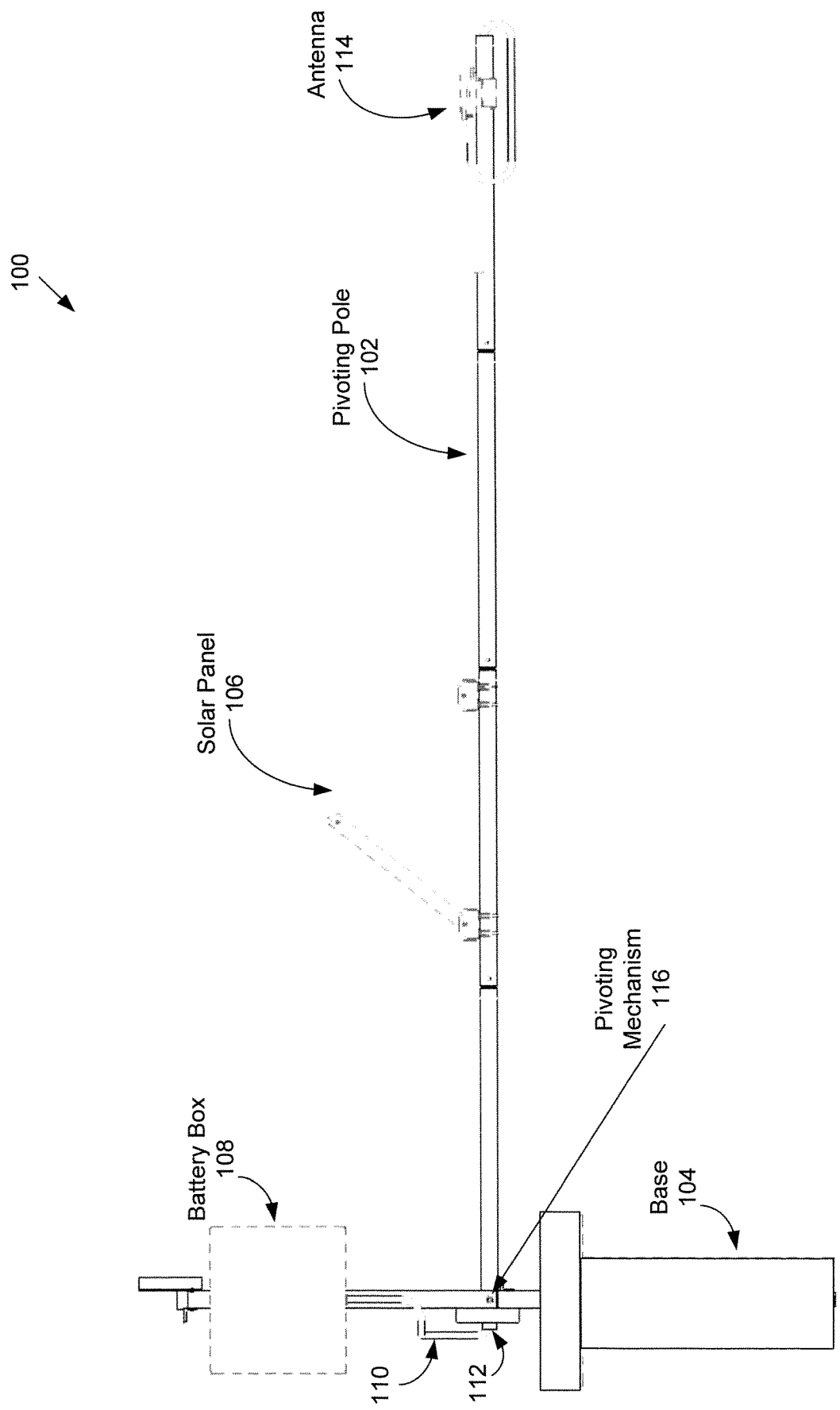
FIG. 1 is a side view of a pivoting tower assembly in the horizontal position, for assembly, in accordance with one or more embodiments of the invention.

Specific embodiments of the invention will now be described in detail with reference to the accompanying figures. Like elements in the various figures are denoted by like reference numerals for consistency. Like elements may not be labeled in all figures for the sake of simplicity.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-7, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Although multiple dependent claims are not introduced, it would be apparent to one of ordinary skill that the subject matter of the dependent claims of one or more embodiments may be combined with other dependent claims.

In general, embodiments of the invention are directed to a method for assembling and erecting a pivoting tower assembly. Further, embodiments of the invention are directed to a pivoting tower assembly having a plurality of poles that may be installed/erected roadside and used for data collection for a variety of applications. More specifically, embodiments of the invention provide a pivoting tower assembly that may be installed/erected by a single person, without the help of heavy machinery or other installation equipment. The pivoting tower assembly may be assembled in a horizontal position, prior to erection, and is equipped with a pivoting mechanism for an easily maneuverable way to stand the assembly up after mounting data collection equipment onto the tower assembly.

FIG. 1 shows a pivoting tower assembly (100) in an assembly position in accordance with one or more embodiments of the invention. In one or more embodiments, the pivoting tower is made up of at least three poles installed side-by-side, with two vertical stationary poles on either side of a middle, pivoting pole. The three poles are installed on a base (104). Those skilled in the art will appreciate that as FIG. 1 shows a view from one side, only one of the two vertical stationary poles can be viewed, with the middle pivoting pole (102) in the horizontal position.

The assembly position of the pivoting tower is defined as the position in which the middle, pivoting pole (102) is horizontal, parallel to the ground. The assembly position allows for ease of installment of various electrical/electronic components onto the middle, pivoting pole, shown in dotted lines in FIG. 1, as optionally present. For example, electronic components that may be installed onto the pivoting pole in assembly position may include, but is not limited to, a solar panel (106), a battery box (108), and one or more antennas (114). These are shown in FIG. 1 as dotted lines because they are optional components that may be mounted to the pivoting pole.

In one or more embodiments, the bottom of the pivoting pole (102) has a hole where a wire harness 112 may be installed. The wire harness (112) allows wires to the mounted components to be run inside the pivoting pole (102). Those skilled in the art will appreciate that the wire harness may be installed such that the wire harness is accessible in both the assembly position (FIG. 1) and the erect position (FIG. 2) of the pivoting tower assembly. In FIG. 1, wire 110 is shown coming out of the bottom end of the pivoting pole and being connected to the battery box (108). Those of ordinary skill in the art will appreciate that multiple wires may be connected to the wire harness (112) and may be run to one or more components mounted on the pivoting pole (102).

Figure 2:
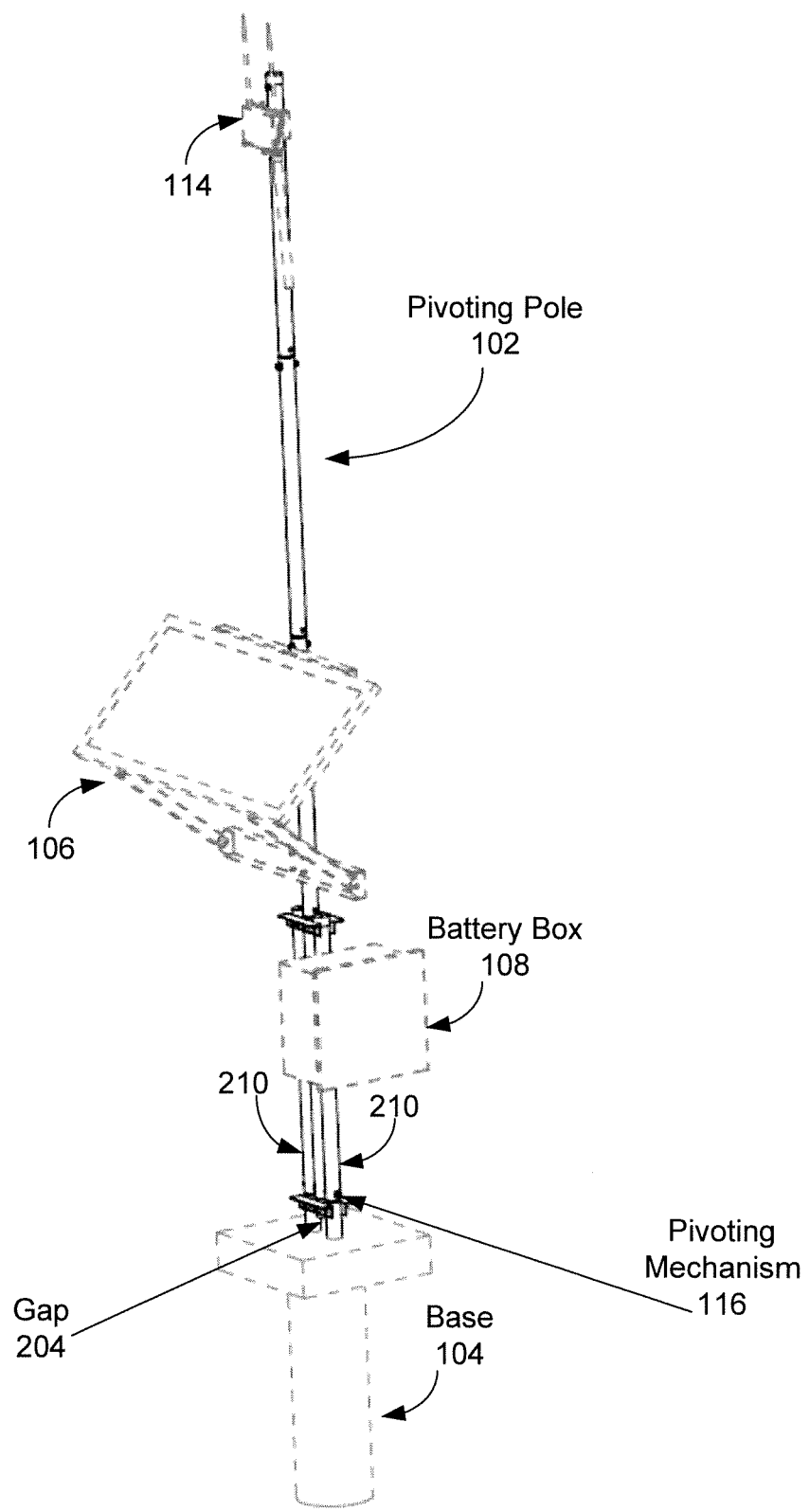
FIG. 2 is a perspective view of a pivoting tower assembly in the vertical position, post assembly, in accordance with one or more embodiments of the invention.

In one or more embodiments, there exists a pivoting mechanism (116) at the junction of the three poles, just above the base (104). The pivoting mechanism may be any combination of screws, bolts, springs, or other connecting mechanisms that allow the pivoting pole (102) to pivot from the assembly position (FIG. 1) to an erect position (FIG. 2). For example, the pivoting mechanism may be a swivel and tilt mechanism, a two-end lockable mechanism, or any other suitable mechanism that has a point of rotation about an axis.

Although not shown in FIG. 1, two vertically affixed poles flank the pivoting pole and are attached to the base (104). The vertically affixed poles do not pivot; rather, they are fixed in place, one on either side of the pivoting pole (102), and may be one or more segments of 4 feet long. Those skilled in the art will appreciate that the base (104) may run into the ground itself, or may stop at the ground level, while the two vertically affixed poles adjacent to the pivoting pole are run into the ground. The vertically affixed poles adjacent to the pivoting pole may be seen in FIGS. 2 and 3, for example.

In one or more embodiments, the purpose of the pivoting pole and components mounted on the pivoting pole may be to collect data about the surrounding area. For example, a DSRC Roadside Unit (RSU) that engages the On Board Units (OBU) of vehicles to acquire traffic information such as time, speed and the location, may be mounted to the pivoting pole and may gather such data periodically. In another example, a solar panel may be mounted for energy generation across highways.

FIG. 2 shows the pivoting tower assembly in an assembled, or erect state in accordance with one or more embodiments. Specifically, FIG. 2 shows the pivoting pole in an erect position, assembled and ready for gathering data. In one or more embodiments of the invention, the erect position is a vertical position, perpendicular to the ground. In FIG. 2, the pivoting pole (102) is shown with the optional electrical components mounted onto the pole (102), with the antenna (114) at the very top of the pole. The pivoting pole (102) in the erect position may be anywhere between 12-30 feet. Those skilled in the art will appreciate that the vertical dimensions of the pivoting pole may be a function of the size of solar panel and the diameter of the pipe. A larger pipe diameter or smaller solar panel allows the pivoting pole to be vertically higher. As can be seen more clearly in FIG. 2, the pivoting pole may be flanked by two vertical fixed poles (210), one on each side of the pivoting pole (102).

In the erect, vertical position, the pivoting pole (102) ends above the base (104), such that there exists a gap (204) under the pivoting pole in the vertical position, between the bottom of the pivoting pole and the base. The two vertically affixed adjacent poles continue downward further into the base, but the pivoting pole stops short of the last junction, before the base. In one or more embodiments, the gap (204) may be used to insert/run wires into or out of wire harness (not shown) at the bottom of the pivoting pole when the pivoting pole is in the erect position. In addition, this gap (204) may be a recognizable feature of the pivoting tower assembly that other roadside installed poles do not exhibit.

Figure 3:
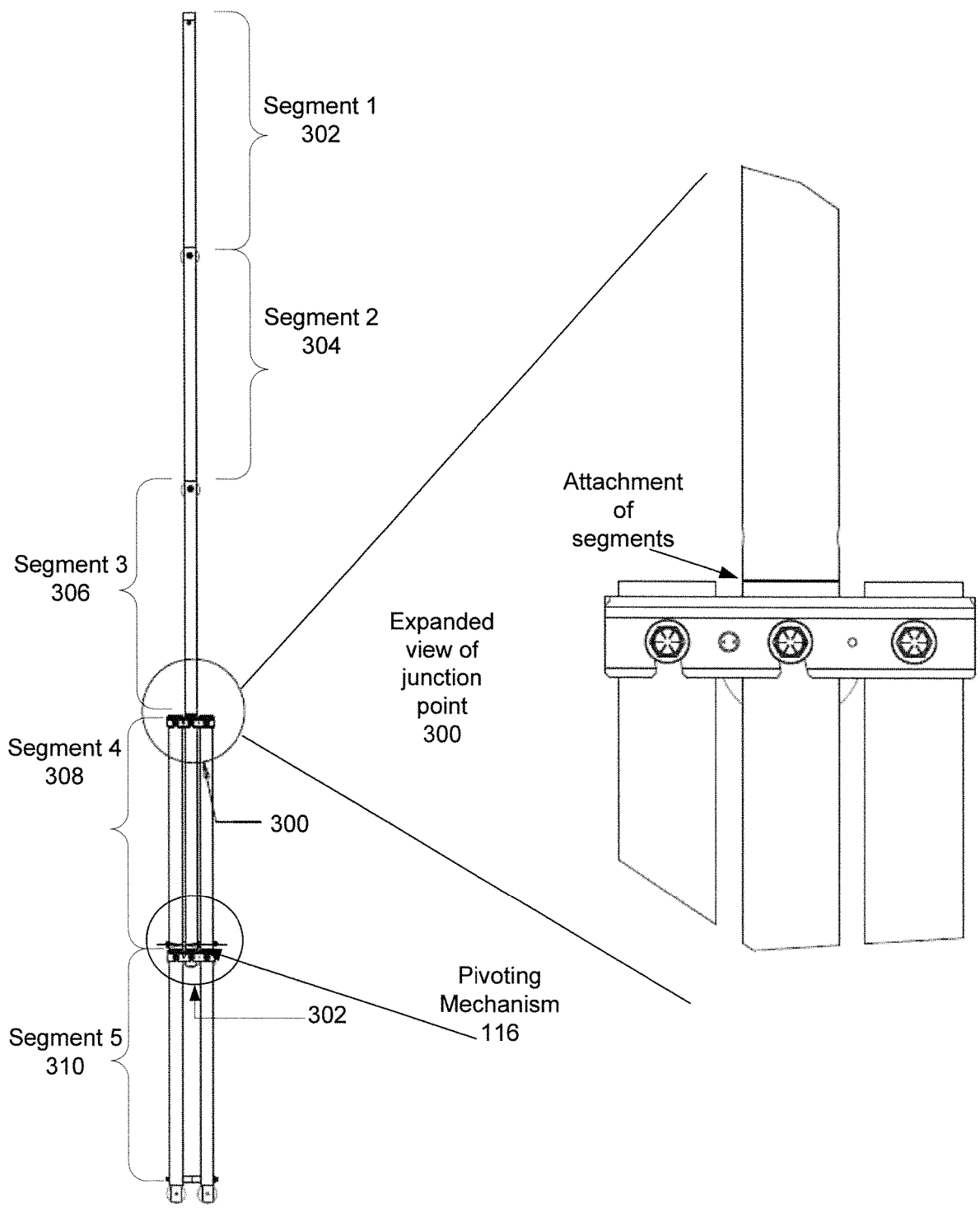
FIG. 3 shows two junction points in the pivoting tower assembly, and an expanded view of one of the two junction points in accordance with one or more embodiments of the invention.

FIG. 3 shows a plurality of segments that make up the pivoting tower assembly in accordance with one or more embodiments. Specifically, FIG. 3 shows multiple segments of the assembly, when the pivoting tower assembly is in the vertical position, where the dimensions of each segment are the same. Each segment is a separate part of the assembly, which is joined to another segment to form the pivoting pole and the two vertically affixed poles on either side of the pivoting pole. In other words, the pivoting pole and the two vertically affixed poles are constructed by attachment pole segments together. In this example, the pivoting pole has four segments (302, 304, 306, 308), and the two vertically affixed poles on either side of the pivoting pole have two segments (308, 310). Thus, there is exactly one segment in which all three poles are included, i.e., segment 4 (308), where the pivoting pole (102) ends, and the two vertically affixed adjacent poles begin. Those skilled in the art will appreciate that there may be any number of segments in the pivoting tower assembly without departing from the scope of the invention. Segment 4 (308) includes two junctions, 300 and 302. An expanded view of junction 300 is shown to the right on FIG. 3, where the attachment of segments is more easily visible. Junction 302 includes the pivoting mechanism (116). The aforementioned gap under the bottom of the pivoting pole is formed above junction 302. As can be seen in FIG. 3, the pivoting pole ends at the pivoting mechanism (116) in junction 302. Below that, in Segment 5 (310), only the base and two adjacent vertically fixed poles continue toward and into the ground.

Figure 4A:
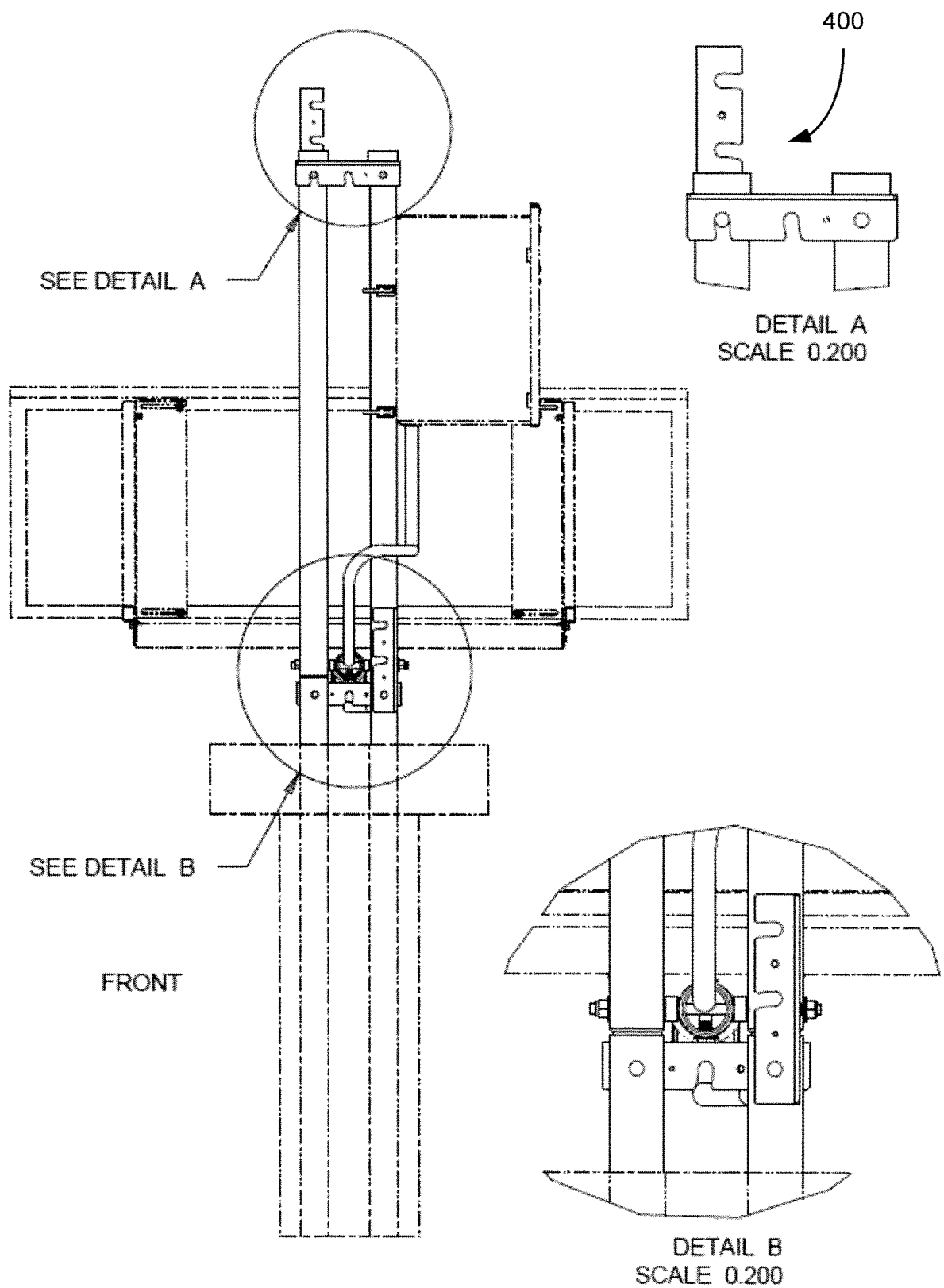
Figure 4C:
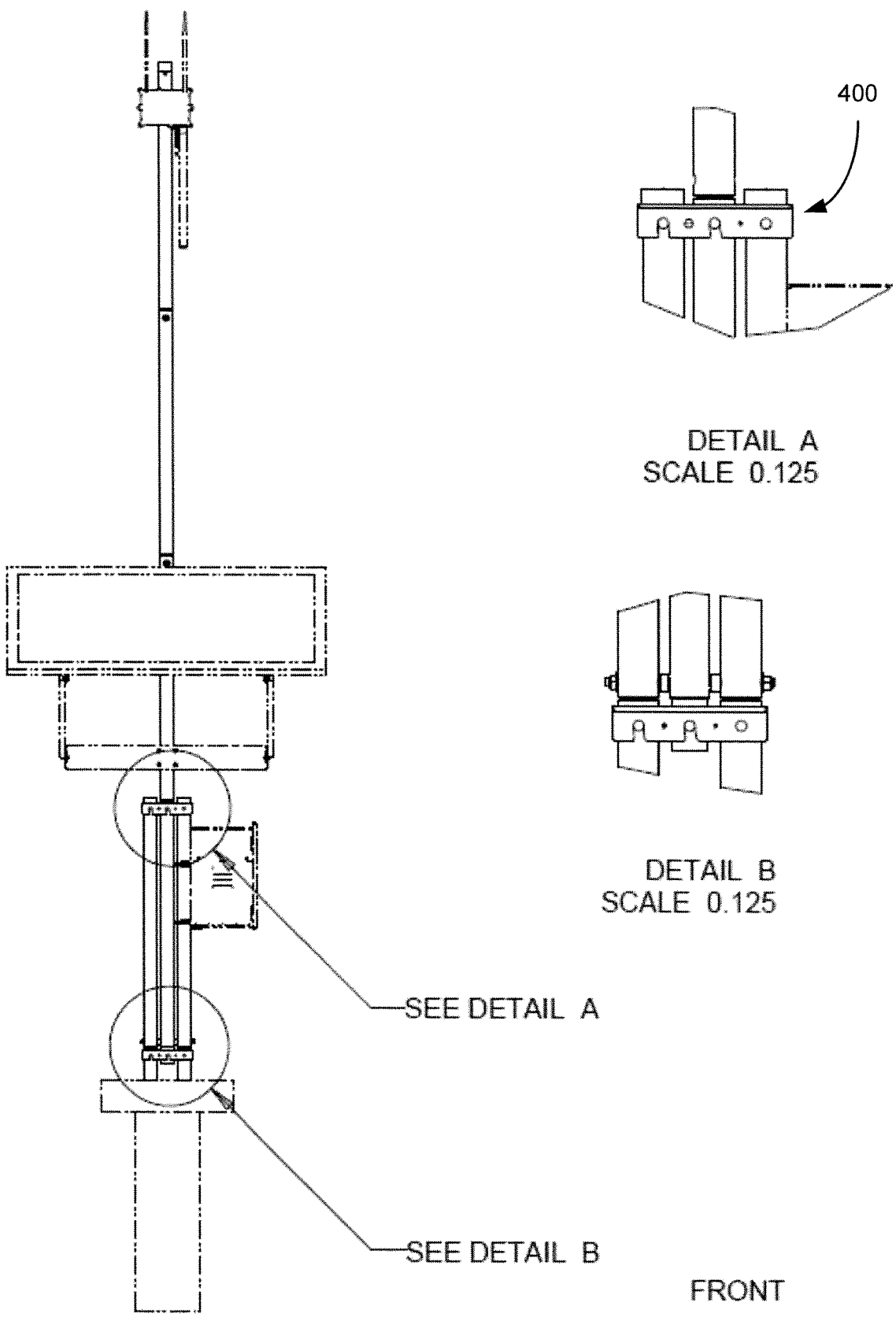

FIGS. 4A-4C show examples of a rotating bracket 400 that is configured to hold the pivoting pole in the vertical, erect position. In one or more embodiments, the bracket rotates to allow the pivoting pole to move vertically upright and then rotates back again to lock into place. As can be seen in FIG. 4A, Detail A shows the bracket in the open position. The bracket includes radiused slots that allow the bracket to rotate. This can also be seen in FIG. 4B, Detail E. Further, the angle shape provides strength to keep pole in place. The bracket design helps the single human installer quickly lock the pivoting pole into place upon pivoting the pole vertically upward. FIG. 4C, Detail A shows the bracket in the closed and locked position.

Figure 5:
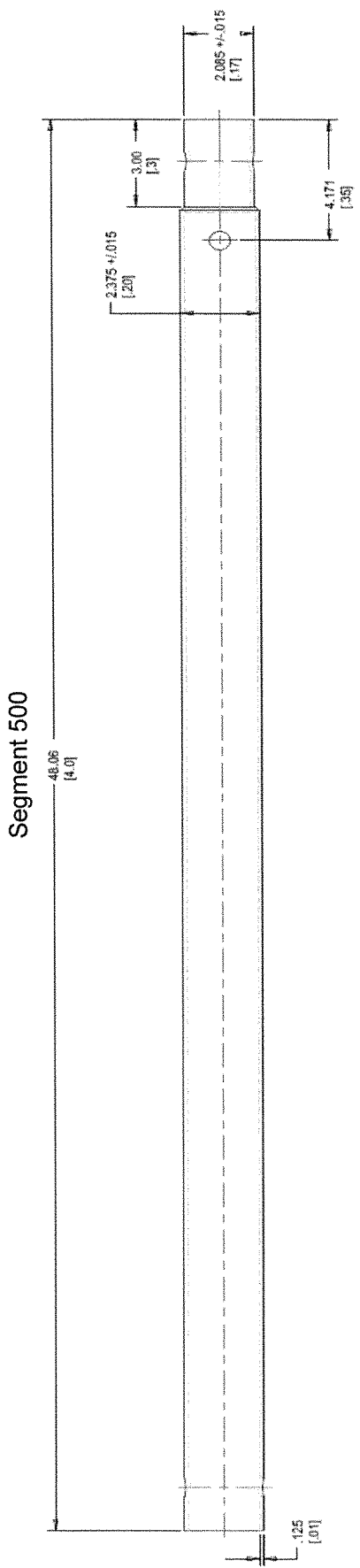
FIG. 5 is a diagram of the dimensions of the of the pivoting tower assembly in horizontal assembly position in accordance with one or more embodiments of the invention.

As described above, FIG. 5 shows the horizontal dimensions of a segment (500) of the pivoting tower assembly in accordance with one or more embodiments. As shown in FIG. 5, the segment (500) of the pivoting tower assembly includes a standard four-foot (4 ft) pole. Multiple such standard 4-ft poles, readily accessible for joining together, are attached to form the pivoting pole and the two adjacent vertically fixed poles. This allows for easy of assembly of the pivoting tower. Those skilled in the art will appreciate that the dimensions shown are provided in feet (units).

Figure 6:
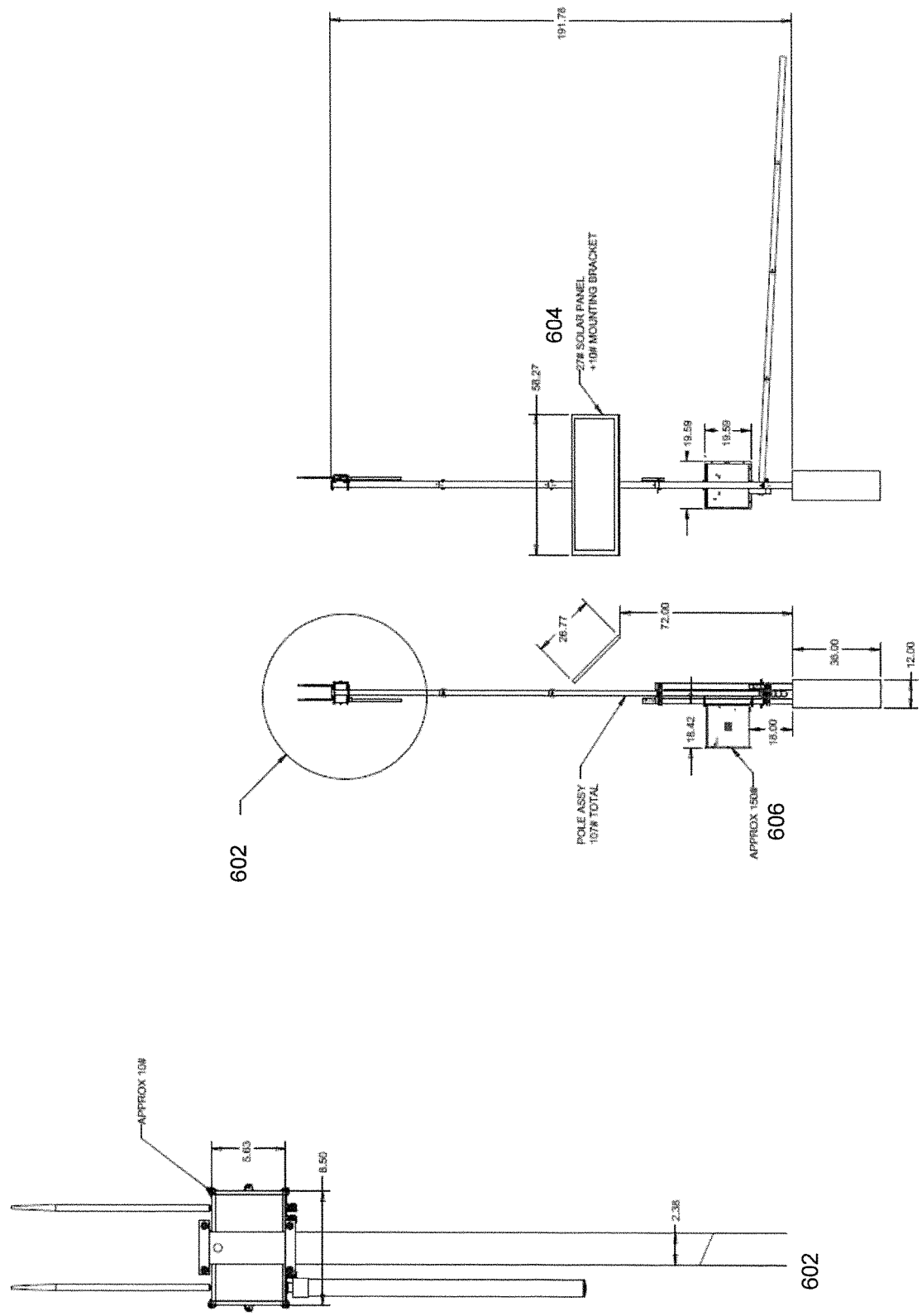
FIG. 6 is a diagram of example dimensions of the various electronic components of the pivoting tower assembly in accordance with one or more embodiments of the invention.

FIG. 6 shows example dimensions of the electrical/electronic components that may be mounted onto the pivoting tower assembly in accordance with one or more embodiments of the invention. Specifically, example dimensions of the solar panel (604), antenna assembly (602), and the battery box (606) are shown. The solar panel (604) may be approximately 58 feet long when mounted on the pole. The battery box (606) height is 19.59 feet, while the width is 18.42 feet. The size of Battery box is 18"×18"×12" and it is approximately 18" off the deck. In one or more embodiments, the tower assembly from the base to the top is shown as having vertical dimensions of approximately 192 inches (16 feet).

Figure 7:
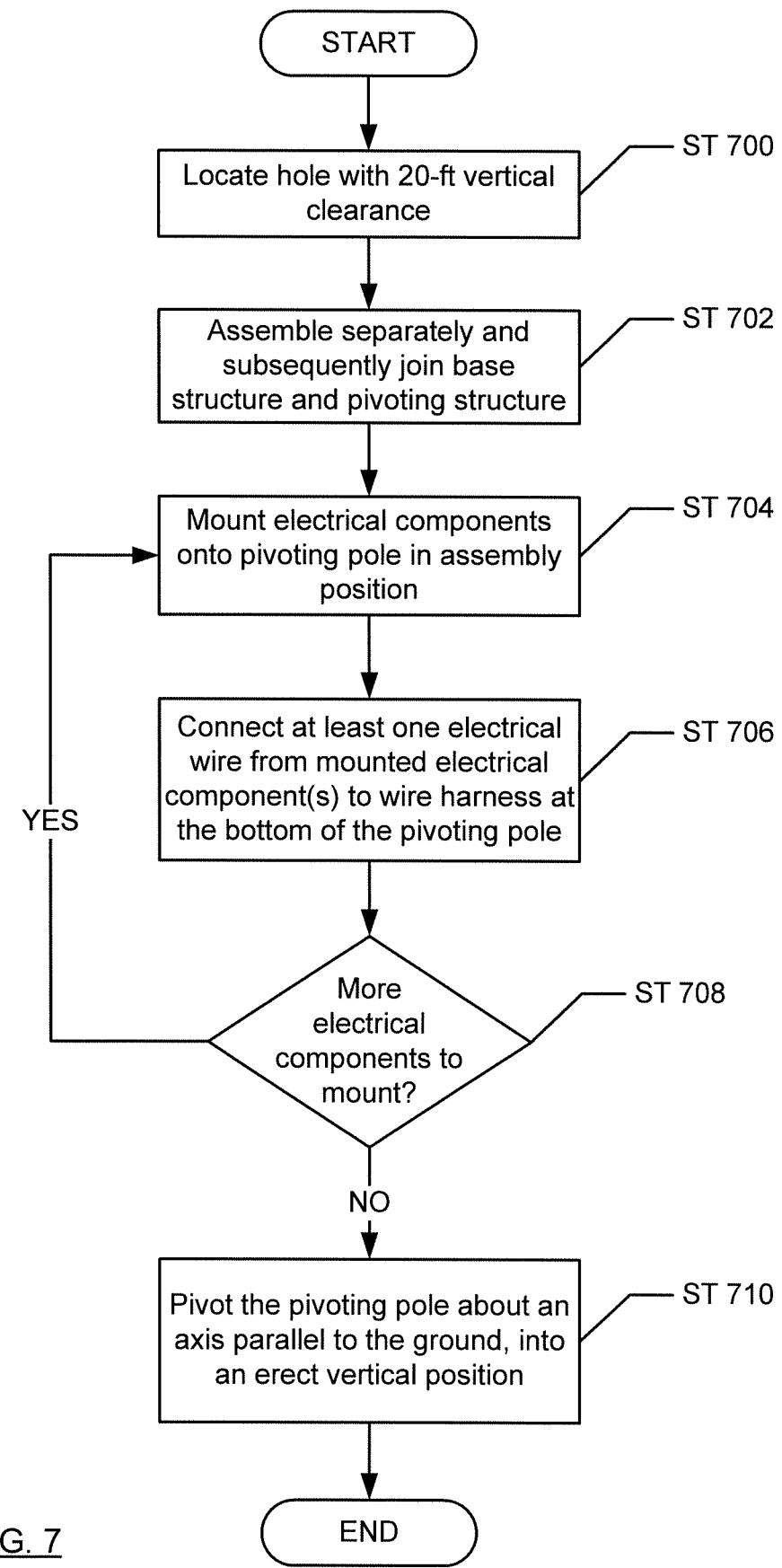
FIG. 7 is a flowchart for assembling and erecting a pivoting tower assembly in accordance with one or more embodiments of the invention.

FIG. 7 shows a flow chart for assembling a pivoting tower assembly in accordance with one or more embodiments of the invention. It is to be understood that, one or more of the steps shown in the flowcharts may be omitted, repeated, and/or performed in a different order than the order shown. Accordingly, the scope of the invention should not be considered limited to the specific arrangement of steps shown in the flowcharts.

Initially, in Step 700, a hole with 20 foot minimum clearance in the vertically north direction may be located. Such a clearance allows the pivoting pole to rotate down for assembly and maintenance and up to the erect, vertical position. In Step 702, the base structure and the pivoting pole structure including the two vertically fixed poles on either side of the pivoting pole may be assembled separately and joined together. The base and pivoting structures are then installed in the hole in the earth located in Step 700. In one or more embodiments, installation may involve pouring concrete around the structure to ensure that the structure is vertical. Those skilled in the art will appreciate that the concrete must set overnight before any hardware is installed on the tower assembly.

Next, the pivoting tower assembly is placed in assembly position, with the pivoting middle pole in a horizontal orientation, parallel to the ground. In the assembly position, at least one electrical component is mounted onto the pivoting pole (Step 704). As described above, the electrical component may be a battery box, an antenna, or a solar panel. In one or more embodiments, the electrical battery box may be mounted first, to the stationary part of pole, i.e., between segments 4 and 5 in FIG. 3.

In Step 706, at least one electrical wire from one or more of the mounted electrical components is connected to the wire harness at the base of the pivoting pole. Specifically, the cables may be connected to the battery box installed in Step 704. In one or more embodiments, the wire harness is affixed onto the bottom of the pivoting pole, and facilitates the running of electrical wires through the pivoting pole, to as many electronic components that may be mounted onto the pivoting pole. In one or more embodiments, the electrical wires may be run inside each 4-ft pole before the 4-ft poles are bolted with each other to form the entirety of the pivoting pole, all while in the assembly position.

At this stage, a determination is made as to whether any other electrical components need to be mounted onto the pivoting pole (Step 708). For example, the solar panel may be installed 6 feet from the ground when in the vertical position. The solar panel cable may be routed on the side of the pole with zip ties. Lastly, the gateway (antenna) may be installed toward the top of the pivoting pole using a bracket and screws. Accordingly, steps 704-706 may be repeated as needed. When all electrical components have been mounted, the process moves to Step 710.

In Step 710, the pivoting pole is pivoted about an axis parallel to the ground, into an erect, vertical position. In one or more embodiments, the pivoting pole, in the erect vertical position, is in line with the two adjacent vertical poles on either side of the middle, pivoting pole. As part of Step 710, the pivoting pole may be locked into the vertical position with one or more brackets as shown in FIGS. 4A-4C above. In one or more embodiments, Step 708 is performed by a single human person, without any additional tools, equipment or manpower. This is advantageous because the pole is able to be pivoted into an erect position by a single person and is locked into place quickly using the rotating bracket(s), regardless of the pole's height and the number of electrical components mounted to the pole.

Those skilled in the art will appreciate that the pivoting tower assembly may be installed on any roadside in any type of geographical location (city, farm, rural area, etc.), for purposes of data collection. Further, as described above, the installation of the pivoting pole may be performed over 2 days, at a minimum, and may be installed by a single human person without use of heavy machinery/tools.

What is claimed is:

1. A method for installing a pivoting tower assembly, comprising:
    mounting at least one electrical component onto a pivoting pole of the pivoting tower assembly, while the pivoting tower assembly is in an assembly position having the pivoting pole oriented horizontally and parallel to the ground;
    connecting an electrical wire from the at least one electrical component to a wire harness permitting the electrical wire to travel inside the pivoting pole;
    pivoting the pivoting pole, about an axis parallel to the ground, from the assembly position into an erect, vertical position with the at least one mounted electrical component; and
    two vertical stationary poles adjacent to the pivoting pole, wherein the pivoting pole in the erect position is positioned between the two vertical stationary poles; and
    locking the pivoting pole into the vertical positon using at least one rotating bracket.

2. The method of claim 1, wherein the at least one electrical component is at least one selected from a group consisting of: a solar panel, a battery box, and an antenna.

3. The method of claim 1, wherein pivoting the at least one pole into an erect position is performed by a single person.

4. The method of claim 1, further comprising, prior to mounting the at least one electrical component, assembling the pivoting pole by adjoining a plurality of 4-foot poles together.

5. The method of claim 1, the pivoting tower assembly comprising a base comprising a pivoting mechanism for the pivoting pole, wherein the two vertical stationary poles extend lower than the base and into the ground.

6. The method of claim 5, wherein a bottom end of the pivoting pole comprising the wire harness is positioned higher than the base of the pivoting tower assembly, such that a hole is formed between the base, the two vertical stationary poles, and the pivoting pole.

7. The method of claim 6, wherein the hole allows for connection of wires to the wire harness in the pivoting pole while the pivoting pole is in the erect position.

8. The method of claim 5, further comprising:
locating a hole with at least a 20 foot clearance in the vertically north direction;
assembling the base and the vertically stationary poles separately;
joining the base and the vertically stationary poles to each other; and
installing the joined base and vertically stationary poles into the hole.

9. A pivoting tower assembly, comprising:
a pivoting pole configured to pivot from an assembly position in which the pivoting pole is oriented horizontally and parallel to the ground, to an erect position in which the pivoting pole is oriented vertically and perpendicular to the ground;
a base comprising a pivoting mechanism about which the pivoting pole pivots; and
at least one electrical component mounted onto the pivoting pole when the pivoting pole is in the assembly position,
at least two vertical stationary poles adjacent to the pivoting pole, wherein the pivoting pole in the erect position is positioned between the two vertical stationary poles,
wherein the pivoting pole comprises a wire harness configured to facilitate the traveling of at least one electrical wire from the at least one electrical component inside the pivoting pole; and
a rotating bracket comprising radiused slots for locking the pivoting pole into the erect position.

10. The pivoting tower assembly of claim 9,
wherein the two vertical stationary poles extend lower than the base and into the ground.

11. The pivoting tower assembly of claim 10, wherein a bottom end of the pivoting pole comprising the wire harness is positioned higher than the base of the pivoting tower assembly, such that a hole is formed between the base, the two vertical stationary poles, and the pivoting pole.

12. The pivoting tower assembly of claim 9, wherein the pivoting tower assembly is installed roadside, and wherein the at least one electrical component is used for data collection.

13. The pivoting tower assembly of claim 9, wherein the at least one electrical component is at least one selected from a group consisting of: a solar panel, a battery box, and an antenna.

14. The pivoting tower assembly of claim 9, wherein pivoting the at least one pole into an erect position is performed by a single person.

15. The pivoting tower assembly of claim 9, wherein the pivoting pole comprises a plurality of 4-foot poles adjoined together to assemble the pivoting pole.

* * * * *